(12) United States Patent  
Takei et al.

(10) Patent No.: US 7,517,633 B2
(45) Date of Patent: Apr. 14, 2009

(54) COMPOSITION FOR FORMING GAP-FILLING MATERIAL FOR LITHOGRAPHY

(75) Inventors: Satoshi Takei, Funabashi (JP); Ken-ichi Mizusawa, Funabashi (JP); Yasuhisa Sone, Chiyoda-ku (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 10/311,959

(22) PCT Filed: Jul. 12, 2001

(86) PCT No.: PCT/JP01/06045

§ 371 (c)(1),
(2), (4) Date: Dec. 20, 2002

(87) PCT Pub. No.: WO02/05035

PCT Pub. Date: Jan. 17, 2002

(65) Prior Publication Data

US 2003/0146416 A1     Aug. 7, 2003

(30) Foreign Application Priority Data

Jul. 12, 2000  (JP) .............. 2000-210844
Sep. 29, 2000  (JP) .............. 2000-298044
Jun. 4, 2001   (JP) .............. 2001-167701

(51) Int. Cl.
  *G03F 7/00*   (2006.01)
  *G03F 7/004*  (2006.01)
(52) U.S. Cl. .............. 430/270.1; 430/286.1; 430/311; 430/313; 430/322; 430/323; 430/905; 430/910

(58) Field of Classification Search ............. 430/270.1, 430/905, 910, 286.1, 311, 322, 313, 323
See application file for complete search history.

(56) References Cited

U.S. PATENT DOCUMENTS 4,784,936 A  *  11/1988  White et al. ............... 430/323

(Continued)

FOREIGN PATENT DOCUMENTS

EP        0 753 885 A1    1/1997

(Continued)

OTHER PUBLICATIONS

Lynch et al., "Properties and Performance of Near UV Reflectivity Control Layers", SPIE vol. 2195, pp. 225-235.

(Continued)

*Primary Examiner*—Amnda C. Walke
(74) *Attorney, Agent, or Firm*—Oliff & Berridge, PLC

(57) ABSTRACT

A composition for forming a gap-filling material for lithography which, as a gap-filling material for lithography superior in planarization ability on a substrate having irregularities such as holes or trenches, causing no intermixing with a resist layer, and having a high dry etching rate as compared with the resist, is used in producing semiconductor devices by a method using the gap-filling material to cover the resist on the substrate having holes having an aspect ratio, defined as height/diameter, of 1 or more to transfer images onto the substrate by utilization of lithographic process, the composition being used to coat the substrate prior to the coating of the resist so as to planarize the substrate surface, and the composition being characterized by containing a polymer solution consisting of a polymer and a solvent.

12 Claims, 2 Drawing Sheets

PLANARIZING FACTOR (%) = 1−(a/b)×100

U.S. PATENT DOCUMENTS

| | | | |
|---|---|---|---|
| 4,835,089 A | | 5/1989 | Iwayanagi et al. |
| 5,276,126 A | | 1/1994 | Rogler |
| 5,486,424 A | | 1/1996 | Nakato et al. |
| 5,723,262 A | * | 3/1998 | Nakamura et al. ....... 430/286.1 |
| 5,756,256 A | * | 5/1998 | Nakato et al. ............ 430/272.1 |
| 5,985,524 A | * | 11/1999 | Allen et al. ................. 430/326 |
| 6,057,239 A | | 5/2000 | Wang et al. |
| 6,316,165 B1 | | 11/2001 | Pavelchek et al. |
| 6,365,321 B1 | * | 4/2002 | Chen et al. ............... 430/270.1 |
| 6,376,149 B1 | * | 4/2002 | Grober et al. ............... 430/139 |
| 6,461,717 B1 | | 10/2002 | Rutter, Jr. et al. |
| 6,514,663 B1 | * | 2/2003 | Hien et al. ............... 430/270.1 |

FOREIGN PATENT DOCUMENTS

| | | |
|---|---|---|
| JP | A 60-50939 | 3/1985 |
| JP | A 61-70720 | 4/1986 |
| JP | A 5-107767 | 4/1993 |
| JP | A 6-267810 | 9/1994 |
| JP | A 11-67767 | 3/1999 |
| WO | WO 96/02066 A | 1/1996 |
| WO | WO 97/33206 | 9/1997 |

OTHER PUBLICATIONS

Taylor et al., "Methacrylate Resists and Antireflective Coatings for 193 nm Lithography", SPIE, vol. 3678, pp. 174-185.

Pampalone T. R. et al., "Novolac Resin Planarization Layers for Multilayer Resist Imaging Systems" Journal of the Electrochemical Society, Electrochemical Society, Manchester, New Hampshire, vol. 133, No. 11, pp. 2394-2398, Nov. 1986.

* cited by examiner

PLANARIZING FACTOR (%) = 1−(a/b)×100

COMPOSITION FOR FORMING GAP-FILLING MATERIAL FOR LITHOGRAPHY

TECHNICAL FIELD

The present invention relates to a novel composition for forming a gap-filling material for lithography. Particularly, the present invention relates to a composition for forming a gap-filling material for lithography that allows the formation of a gap filling material for lithography having an excellent planarization property on a substrate having irregularities such as holes and trenches, and large dry etching rate as compared with that of a resist while providing an excellent resist pattern without causing an intermixing with a resist layer, and that it can be specifically used in a damascene process for the introduction of a wiring material Cu (copper) used for reducing a wiring delay of a semiconductor device in recent years.

BACKGROUND ART

The fine processing with lithography using a photoresist has been conducted for the preparation of semiconductor device. Said fine processing comprises forming a thin film of a photoresist composition over a silicon wafer, irradiating active light ray such as UV light ray through a mask over which the pattern of a semiconductor device has been drawn, developing and executing the etching treatment of silicon wafer of thus obtained resist pattern as a protective film. As the integration degree of a semiconductor device has been increased in recent years, there is a tendency of shortening the wavelength of the active light ray used in the above-mentioned process from i-ray (365 nm) to KrF excimer laser (248 nm). Along this process, the influence of an irregular reflection of the active light ray and a standing wave from the substrate have become major concerns. As a method of providing solutions to such concerns, a method of providing a bottom anti-reflective coating (BARC) between the photoresist and the substrate has been extensively investigated.

As the above-mentioned bottom anti-reflective coating, an inorganic bottom anti-reflective coating comprised of titanium, titanium dioxide, titanium nitride, chromium oxide, silicon oxide nitride, or the like, and an organic bottom anti-reflective coating comprised of a light-absorbing material and a polymer compound are known. The former requires facilities such as vacuum deposition equipment, a CVD device, or a spattering device for formation of the coating. On the other hand, the latter has an advantage in that it does not require any special facilities and thus various investigations have been conducted. Examples of such investigations include an acrylic resin type bottom anti-reflective coating where a hydroxyl group provided as a crosslinking functional group and a light-absorbing group are contained in the same molecule as described in the specification of U.S. Pat. No. 5,919, 599, a novolac resin type bottom anti-reflective coating where a hydroxyl group provided as a crosslinking functional group and a light-absorbing group are contained in the same molecule as described in the specification of U.S. Pat. No. 5,693, 691, and so on.

The desirable physical properties for the material to be used for the organic bottom anti-reflective coating include: a high absorbance with respect to light and radiation ray; insolubility to a resist solvent (absence of intermixing with a resist layer); no diffusion of small molecule into overcoating resist from the bottom anti-reflective coating material when applied on dried with heating; large dry etching rate as compared with that of the resist; and so on. For instance, they are also described in Proc. SPIE, Vol. 3678, 800-809, Proc. SPIE, Vol. 3678, 174-185 (1999), and Proc. SPIE, Vol. 2195, 225-229 (1994).

However, in the case of an LSI pattern rule having the degree of fineness for less than 0.13 μm, the delay in wiring affects speeding-up of LSI and thus advancing high-performance of LSI with the present technology for the production has become difficult, so that progress can be hardly made in the speed-up of LSI by means of the present LSI-processing technology. Therefore, Cu is one of the wiring materials used for minimizing the delay in wiring.

A dual damascene process is a technology to be introduced for replacing Al currently used as a wiring material with Cu, for example, as described in the specification of U.S. Pat. No. 6,057,239 B. In this process, a bottom anti-reflective coating is used on a substrate having a large aspect ratio (high/diameter; irregularity) as compared with that of the substrate of the conventional wiring material Al.

In addition to the above characteristics, it is desired that the bottom anti-reflective coating for the dual damascene process has an ability of controlling the coating property of the bottom anti-reflective coating in the ground substrate at the periphery of a hole, a high absorbance with respect to light and radiation ray when a bottom anti-reflective coating is applied with a uniform film thickness is carried out, and a high degree of planarization independent of the irregular shape of the substrate. However, it is difficult to use the organic bottom anti-reflective coating material as a bottom anti-reflective coating material for the dual damascene process.

Consequently, it is conceivable that the process may use two layers of: an inorganic or organic bottom anti-reflective coating having a high absorbance with respect to that of light or radiation ray; and a gap-filling material for lithography for obtaining planarization. The gap-filling material for lithography described herein is a gap-filling material, i.e., a filler or a planarizing material. The advantage of such a process is to provide a high resolution in the step of lithography and to increase an etching selectivity with a base substrate in the step of etching. The gap-filling material for lithography planarizes the irregularities of the substrate. Simultaneously, it has a high etching rate because of containing no compound having an absorbance. Therefore, a high etching selectivity with a resist can be attained in the step of etching.

The required characteristics of the gap-filling material for lithography include an insolubility to a resist solvent (no occurrence of intermixing with a resist layer), no low-molecular substance diffused from the bottom anti-reflective coating material into a top-coat resist at the time of coating or at the time of heat-drying, a high dry etching rate as compared with that of the resist, the ability to planarize the substrate having a large aspect ratio (height/diameter; irregularity), and so on. The development of a gap-filling material for lithography that satisfies all of the above requirements has been desired.

That is, an object of the present invention is to provide a composition for forming a gap-filling material for lithography to be used in a damascene process, having an excellent property of planarizing a substrate surface having irregularities such as holes and trenches, no mixing with a resist layer, forming excellent resist pattern and large dry etching rate as compared with that of a resist, and also to provide a method of forming a resist pattern using the composition for forming gap-filling material for lithography.

DISCLOSURE OF THE INVENTION

In consideration of current conditions described above, as the result of extensive researches conducted by the present inventors, the present invention has been completed by finding the facts that in order to increase planarization property of a substrate without depending an irregular shape thereof in a case where a composition for forming a gap-filling material for lithography is applied with a uniform film thickness, a specific relationship between the solid content concentration of a polymer solution contained in the composition for forming a gap-filling material for lithography and a viscosity thereof is satisfied, that a specific relationship between a polymer and a solvent used in the polymer solution is satisfied, and that such a polymer preferably has a p-vinylphenol structure.

The present invention relates to:

according to a first aspect of the invention, a composition for forming a gap-filling material to be used in production of a semiconductor device by a method of applying a resist for coating onto a substrate having holes where an aspect ratio defined as height/diameter is 1 or more and transferring an image on the substrate using a lithographic process, which is applied to the substrate prior to the coating with the resist so as to planarize the surface of the substrate, characterized by containing a polymer solution comprised of a polymer and a solvent;

according to a second aspect of the invention, the composition for forming a gap-filling material according to the first aspect of the invention, characterized in that the polymer solution has a coefficient H of 0.06 or less, which is defined as [logarithmic change in viscosity (mPas)]/[change in solid content concentration (% by weight)], and a viscosity of 1 to 80 mPas, which is measured at a solid content concentration of 25% by weight;

according to a third aspect of the invention, the composition for forming a gap-filling material according to the first aspect or the second aspect of the invention, characterized in that the polymer solution contains 0.1 to 30% by weight of solid content;

according to a forth aspect of the invention, the composition for forming a gap-filling material according to one of the first aspect to the third aspect of the invention, characterized in that the solvent contains 20% by weight or more of a solvent (s) having a boiling point higher than a glass transition temperature of the polymer based on the whole solvent;

according to a fifth aspect of the invention, the composition forming a gap-filling material according to the fourth aspect of the invention, characterized in that the boiling point of the solvent (s) is 10° C. or more higher than the glass transition temperature of the polymer;

according to a sixth aspect of the invention, the composition for forming a gap-filling material according to one of the first aspect to the fifth aspect of the invention, characterized in that the boiling point of the solvent (s) is from 145 to 220° C.;

according to a seventh aspect of the invention, the composition for forming a gap-filling material according to one of the first aspect to the sixth aspect of the invention, characterized in that the solvent (s) is butyl lactate, propylene glycol monobutyl ether, propylene glycol monomethylether acetate, cyclohexanone, diethylene glycol monomethylether, or any mixture thereof;

according to an eighth aspect of the invention, the composition for forming a gap-filling material according to one of the first aspect to the seventh aspect of the invention, characterized in that a weight-average molecular weight of the polymer is from 500 to 30000;

according to a ninth aspect of the invention, the composition for forming a gap-filling material according to one of the first aspect to the eighth aspect of the invention, characterized in that the polymer comprises at least one repeating unit represented by the following Formula (1):

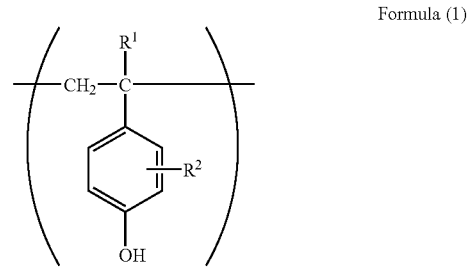

Formula (1)

[wherein $R^1$ and $R^2$ each independently represent a hydrogen atom, a methyl group, a fluorine atom, a chlorine atom, a bromine atom or a cyano group];

according to a tenth aspect of the invention, the composition for forming a gap-filling material according to the ninth aspect of the invention, characterized in that the polymer is a homopolymer comprised of the repeating unit represented by the Formula (1), or a copolymer comprised of the repeating unit represented by the Formula (1) and a repeating unit which is a vinyl group that contains an aromatic moiety or a carboxylic acid ester moiety on a side chain thereof;

according to an eleventh aspect of the invention, the composition for forming a gap-filling material according to the tenth aspect of the invention, characterized in that the polymer is poly p-vinylphenol that comprises a repeating unit represented by the following Formula (2):

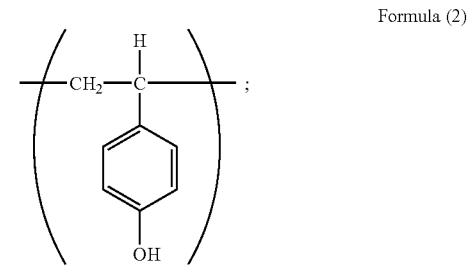

Formula (2)

according to a twelfth aspect of the invention, the composition for forming a gap-filling material according to the tenth aspect of the invention, characterized in that the polymer is a bromide of poly p-vinylphenol, which comprises a repeating unit represented by the following Formula (3):

Formula (3)

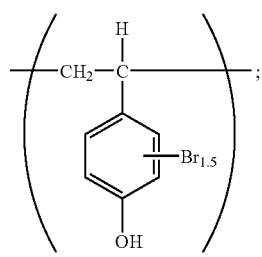

according to a thirteenth aspect of the invention, the composition for forming a gap-filling material according to the tenth aspect of the invention, characterized in that the polymer is a copolymer of p-vinylphenol and styrene, which comprises a repeating unit represented by the following Formula (2):

Formula (2)

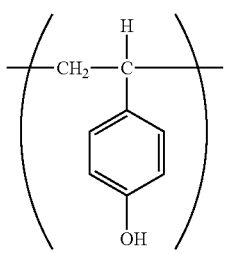

and a repeating unit represented by the following Formula (4):

Formula (4)

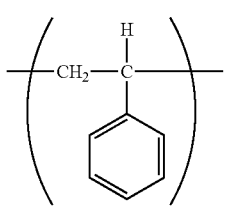

and in which 20% or more of the repeating unit represented by the Formula (2) is contained based on the total number of the repeating units in the polymer;

according to a fourteenth aspect of the invention, the composition for forming a gap-filling material according to the tenth aspect of the invention, characterized in that the polymer is a copolymer of p-vinylphenol and methyl methacrylate, which comprises a repeating unit represented by the following Formula (2):

Formula (2)

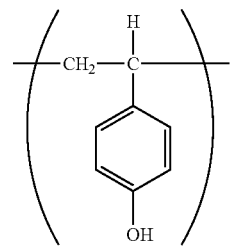

and a repeating unit represented by the following Formula (5):

Formula (5)

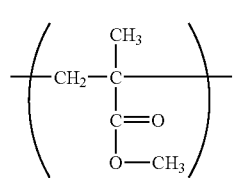

and in which 20% or more of the repeating unit represented by the Formula (2) is contained based on the total number of the repeating units in the polymer;

according to a fifteenth aspect of the invention, the composition for forming a gap-filling material according to the tenth aspect of the invention, characterized in that the polymer is a copolymer of p-vinylphenol and 2-hydroxyethyl methacrylate, which comprises a repeating unit represented by the following Formula (2):

Formula (2)

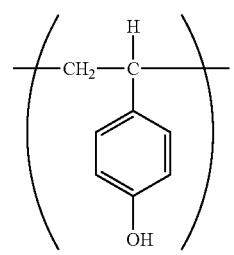

and a repeating unit represented by the following Formula (6):

Formula (6)

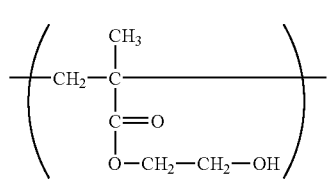

and in which 20% or more of the repeating unit represented by the Formula (2) is contained based on the total number of the repeating units in the polymer;

according to a sixteenth aspect of the invention, the composition for forming a gap-filling material according to the tenth aspect of the invention, characterized in that the polymer is a copolymer of p-vinylphenol and butyl acrylate, which comprises a repeating unit represented by the following Formula (2):

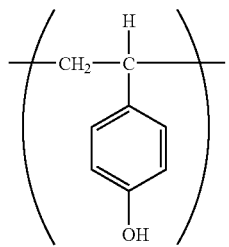

Formula (2)

and a repeating unit represented by the following Formula (7):

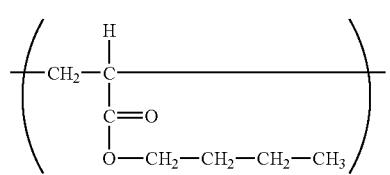

Formula (7)

and in which 20% or more of the repeating unit represented by the formula (2) is contained based on the total number of the repeating units in the polymer;

according to a seventeenth aspect of the invention, the composition for forming a gap-filling material according to one of the first aspect to the sixteenth aspect of the invention, characterized by further comprising a cross-linking agent having at least two cross-linking forming functional groups;

according to an eighteenth aspect of the invention, a method of using a composition for forming a gap-filling material according to one of the first aspect to the seventeenth aspect of the invention, characterized in that the gap-filler forming composition is applied onto a substrate and is then baked in a lithographic process in production of a semiconductor device;

according to a nineteenth aspect of the invention, a method of manufacturing a semiconductor device forming an integrated circuit element by transferring an image on a substrate, characterized by comprising:

a step (A) in which the composition for forming a gap-filling material containing a polymer solution comprised of a polymer and a solvent is applied to a substrate having holes with an aspect ratio of 1 or more, which is defined as height/diameter, and is then dried to form a planarized filling layer on the substrate;

a step (B) in which a resist is applied and dried; and a step (C) in which an exposure, a development, and an etching are performed;

according to a twentieth aspect of the invention, the method of manufacturing a semiconductor device according to the nineteenth aspect of the invention, characterized in that the composition for forming a gap-filling material used in the step (A) is a composition according to one of the first aspect to the seventeenth aspect of the invention; and according to a twenty first aspect of the invention, the method of manufacturing a semiconductor device according to the nineteenth aspect of the invention, characterized by further comprising a step (A') where a bottom anti-reflective coating is formed before or after the formation of a filling layer using the composition for forming a gap-filling material in the step (A).

BEST MODE FOR CARRYING OUT THE INVENTION

Figure 1:
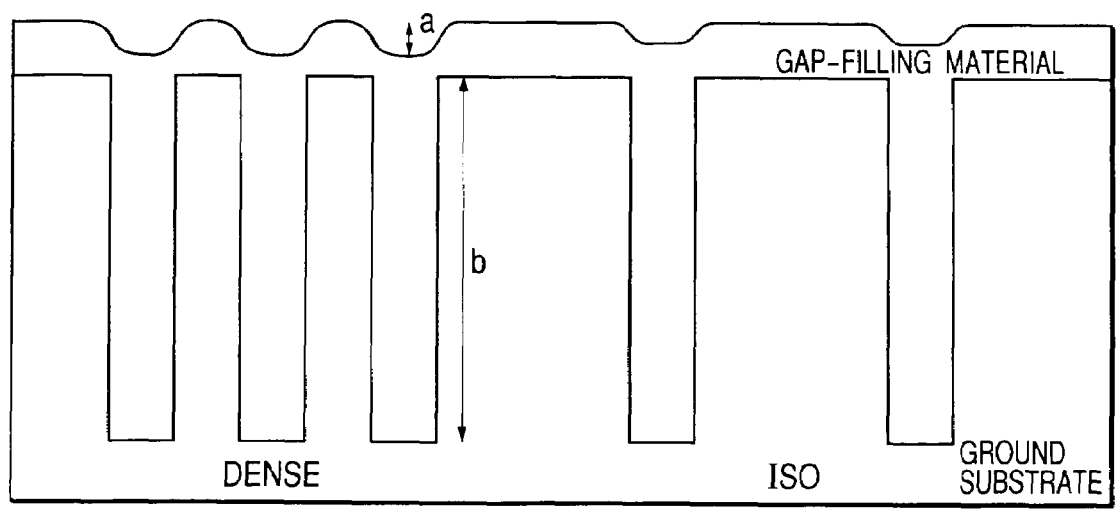
FIG. 1 is a cross-sectional view of a state in which a gap-filling material is applied to a substrate having holes, where reference symbol a denotes a depth (μm) of a recessed portion of the gap filling material for lithography in the center of the hole, and reference symbol b denotes an initial depth (μm) of a hole of the substrate used.

A dual damascene method is a method of forming a wiring groove (a trench) and a connecting hole (a hole) on the same place on a substrate and filling them with Cu to make use thereof. The dual damascene method is capable of overcoming problems concerning miniaturization of a chip size and a wiring delay thereof.

A ground material such as a bottom anti-reflective coating material is applied between a substrate and a resist to avoid making a square-shaped resist pattern unobtainable by a reflection from the upper surface of the substrate, i.e., a reflection from the bottom surface of a photoresist, at the time of coating the photoresist and transferring an image onto the substrate using a lithographic process.

However, the substrate to be used in the dual damascene process has holes with an aspect ratio defined as height/diameter of 1 or more, normally in the range of 1 to 20. Thus, the ground material such as the conventional bottom anti-reflective coating material may have a poor flowing property, so that the ground material cannot flow into every part of the hole. As a result, a recessed portion of the ground material is generated in the center portion of the hole after that the ground material is applied using an spinner and is then dried. Even though the resist had applied to it, therefore, there was a case that an appropriate pattern could not be obtained due to a diffused reflection caused by the irregularity of the bottom surface of a resist.

It is found that a decrease in the fluidity of the ground material is caused by an increase in the viscosity of the ground material as a result of an increase in the solid content concentration of the base material as the solvent in the ground material is evaporated by a rotation of the substrate at the time of the application of the ground material to the substrate using the spinner through dropping. The solid content concentration of the ground material before the application is normally about 10% by weight. On the other hand, when the ground material is allowed to flow into the hole on the spinner, the increment of its solid content may be about 20 to 50% by weight, or about 70% by weight depending on the conditions. In other words, comparing with viscosity before the application, the ability of flowing into the hole decreases due to a proportional increase in the viscosity caused by an increase in the solid content concentration. Therefore, a desired ground material is of a small change in its viscosity even though the solid content concentration thereof increases.

Furthermore, for concurrently forming holes and trenches by etching, there is a need for the ground material of the above-mentioned process to have large dry etching rate as compared with that of the resist. The ground material such as a bottom anti-reflective coating material has a low dry etching rate in general because it is provided with an anti-reflective function and it has a light-absorbing portion (chromophore) with a large absorption coefficient allowing the ground material to absorb exposure light. Therefore, it is preferable that the ground material does not include any chromophore in order to increase the dry-etching rate.

The planarization of a substrate having holes is performed at first by the application of a ground material using a spinner (the first step of planarization). In this regard, the present inventors find that a favorable flow characteristic of the ground material to be required for planarizing at the time of the above application can be attained when a viscosity measured at a solid content concentration of 25% by weight is 1 to 80 mpas and a coefficient H defined as [logarithmic change in viscosity (mPas)]/[change in solid content concentration (% by weight)] is 0.06 or less. In addition, it is also found that a composition containing a polymer solution that satisfies such a condition is suitable for the formation of a gap filling material for lithography to be used for planarizing the substrate having the holes.

Here, a value of the logarithmic change in the viscosity is represented as a common logarithmic value. Also, 25% by weight in solid content concentration is a concentration when the flow into the hole is expected. The range from 1 to 80 mPas is a necessary viscosity range for ensuring a good ability of flowing into the hole with an aspect ratio of 1 or more. For preventing the viscosity from largely changing due to variations in solid content concentration, a polymer solution capable of keeping the above coefficient H at 0.06 or less is used. The approach of coefficient H to zero means that the viscosity (logarithm) varies within a narrow range with respect to variations in solid content concentration. Therefore, the coefficient H may be ideally zero. In reality, it is in the range of $0.02 \leq H \leq 0.06$. The coefficient H can be easily determined by actual measurement of the percentage change of viscosity for a solid content concentration of about 8% by weight to 25% by weight using an E-type viscometer at 25° C.

However, even after the application of the ground material to the substrate using the spinner, the ground material is still not filled in the hole all over and a void may be remained in the hole. In such an event, there is a need to planarize the void at the time of heat-curing of the ground material (the second step of planarizing). That is, the second step of planarizing is required to hold up an increase in the solid content concentration at the time of heat-curing of the ground material and also to provide the ground material with a fluidity even at the time of heating at a glass transition temperature of the polymer or higher.

Such characteristics can be attained as follows: at least part of a solvent that forms a polymer solution consists of a solvent (s) having a boiling point higher than the glass transition temperature of the polymer, preferably higher than it by 10° C. or higher. Furthermore, it is preferable that the boiling point of the solvent (s) ranges from 145° C. to 220° C. Using such a solvent (s) having a high boiling point makes that the volatile rate of the solvent smaller in the step of baking, so that an increase in viscosity can be retarded. The retardation of the rise in the viscosity causes the fluidization of the polymer solution when the polymer is heated at a glass transition temperature of the polymer or higher, so that the void remained in the hole can be perfectly filled and the applied ground material can be entirely fluidized. Therefore, even if there is a recessed portion formed in the upper portion of the hole by filling the hole, the ground material directly flows into it from the surroundings to planarize the base material formed on the substrate.

However, an excessively high boiling point of the solvent (s) is also undesirable. This is because the solvent cannot be vaporized and remained in the gap filling material at the time of heat-curing generally performed at 220° C. or less after the spin-coating. Therefore, it is preferable that the solvent (s) to be used for the above polymer solution has a boiling point in the range of 145° C. to 220° C. A solvent in such a polymer solution is mainly comprised of the solvent (s) having a high boiling point, while allowing a solvent having a low boiling point to be mixed therein. However, the solvent (s) may be contained at a percentage of 20% by weight or more, preferably 30% by weight or more in the total solvents. The solvent only consisting of the solvent (s) having the high boiling point may be used. In general, however, the solvent (s) having the high boiling point is used at a percentage of 20 to 80% by weight, preferably 30 to 80% by weight in the whole solvent. If such a percentage is less than 20% by weight, the fluidity of the polymer decreases as the solvent is entirely vaporized at the time of baking, worsening the planarization property. On the other hand, if it exceeds 80% by weight, there is a problem in the surface property of the applied gap filler.

The composition for forming a gap-filling material of the present invention can be used for planarizing the surface of the substrate by coating the substrate with the composition, and brings about an effect of confining a low-molecular weight compound to be escaped from the substrate.

In addition to the above polymer solution, the composition for forming a gap-filling material of the present invention may further comprise a cross-linking agent having at least two cross-linking forming functional groups, a cross-linking catalyst, and another additive according to need. The total solid content including the polymer, the cross-linking agent, and the cross-linking catalyst is 0.1 to 30% by weight, preferably 0.1 to 20% by weight. Furthermore, the content of the polymer is 30 to 99% by weight, preferably 50 to 90% by weight with respect to the total solid content.

The molecular weight of the polymer in the polymer solution to be contained in the composition for forming a gap-filling material of the present invention may be of a weight-average molecular weight of 1000 to 100000, preferably 1000 to 60000, further preferably 1000 to 30000, even though it varies depending on the used solvent to be applied, the viscosity of the solution, the shape of the film and so on. If the weight-average molecular weight of the polymer is less than 1000, it is difficult to obtain a film in an amorphous state. Also, in the step of baking it is highly possible for the polymer to sublimate, which makes it difficult to obtain the planarized film. Furthermore, among the polymers having a weight-average molecular weight of more than 30000, those that meet the above viscosity conditions are few.

The above-mentioned polymer may preferably be a polymer that contains at least 1 or more hydroxyl groups, which are cross-linking forming functional groups, per repeating unit. Examples thereof include thermoplastic polymers which are obtained by polymerizing compounds having one addition-polymerization unsaturated bond in a molecule selected from acrylic acids, hydroxyalkyl acrylates, hydroxyalkyl methacrylates, styrenes, celluloses, crotonic acids and so on, thermosetting phenol resins and so on.

Hereinafter, the examples of acrylic acids, hydroxyalkyl acrylates, hydroxyalkyl methacrylates, styrenes, celluloses, and crotonic acids will be described, respectively.

Acrylic acids: acrylic acid, and methacrylic acid.

Hydroxyalkyl acrylates: hydroxyalkyl acrylates having a side-chain alkyl group of 1 to 10 carbon atoms, for example, hydroxymethyl acrylate, hydroxyethyl acrylate, hydroxypropyl acrylate, and hydroxybutyl acrylate.

Hydroxyalkyl methacrylates: hydroxyalkyl methacrylates having a side-chain alkyl group of 1 to 10 carbon atoms, for example, hydroxymethyl methacrylate, hydroxyethyl methacrylate, hydroxypropyl methacrylate, and hydroxybutyl methacrylate.

Styrenes: hydroxy styrene, hydroxybromo styrene, and carboxy styrene.

Celluloses: cellulose, cellulose acetate, cellulose nitrate, and chitosan.

Crotonic acids: crotonic acids having an alkyl group of 1 to 10 carbon atoms, for example, methyl crotonate, ethyl crotonate, propyl crotonate, and butyl crotonate.

Phenol resins can be obtained by polycondensation between phenols and aldehydes in the presence of an acidic catalyst. The phenols to be used therein include, for example, phenol, o-cresol, m-cresol, p-cresol, o-ethyl phenol, m-ethyl phenol, p-ethyl phenol, o-butyl phenol, m-butyl phenol, p-butyl phenol, 2,3-xylenol, 2,4-xylenol, 2,5-xylenol, 3,4-xylenol, 3,5-xylenol, 2,3,5-trimethyl phenol, 3,4,5-trimethyl phenol, p-phenyl phenol, hydroquinone, catechol, resorcinol, 2-methyl resorcinol, pyrogallol, α-naphthol, β-naphthol, bisphenol A, dihydroxybenzoic acid ester, o-nitrophenol, m-nitrophenol, p-nitrophenol, o-chlorophenol, m-chlorophenol, p-chlorophenol and so on. Among them, o-cresol, m-cresol, p-cresol, 2,3-xylenol, 2,4-xylenol, 2,5-xylenol, 2,3,5-trimethyl phenol, resorcinol and 2-methyl resorcinol are preferable.

Furthermore, the aldehydes to be polycondensed with the above-mentioned phenols include, for example, formaldehyde, trioxan, paraformaldehyde, benzaldehyde, acetaldehyde, propyl aldehyde, phenyl aldehyde, α-phenylpropyl aldehyde, β-phenyl-propyl aldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, o-ethylbenzaldehyde, m-ethylbenzaldehyde, p-ethylbenzaldehyde, p-normal butyl aldehyde, furfural, 1-naphtoaldehyde, 2-naphtoaldehyde and 2-hydroxy-1-naphtoaldehyde. Among them, formaldehyde is specifically preferable.

The above-mentioned polymer can be copolymerized with an uncross-linkable monomer except the polymer described above, so that dry etching speed, reflectivity and so on can be finely adjusted. This kind of copolymerizable monomers include, for example, a compound having one addition-polymerization unsaturated bond selected from acrylic esters, acrylamides, methacrylic esters, methacrylamides, allyl compounds, vinyl ethers, vinyl esters, styrenes and crotonic esters.

Hereinafter, the examples of acrylic esters, acrylamides, methacrylate esters, methacrylamides, allyl compounds, vinyl ethers, vinyl esters, styrenes, and crotonic esters will be described, respectively.

Acrylic esters: alkyl acrylate having an alkyl group of 1 to 10 carbon atoms.

Methacrylic esters: alkyl methacrylate having an alkyl group of 1 to 10 carbon atoms.

Acrylamides: acrylamide, N-alkylacrylamide, N-arylacrylamide, N,N-dialkyl acrylamide, N,N-arylacrylamide, N-methyl-N-phenylacrylamide, and N-2-acetamidoethyl-N-acetylacrylamide.

Methacrylamides: methacrylamide, N-alkylmethacrylamide, N-arylmethacrylamide, N,N-dialkylmethacrylamide, N,N-diarylmethacrylamide, N-methyl-N-phenylmethacrylamide, and N-ethyl-N-phenylmethacrylamide.

Vinyl ethers: alkylvinyl ether, and vinylaryl ether.

Vinyl esters: vinyl butyrate, vinyl isobutyrate, and vinyltrimethyl acetate.

Styrenes: styrene, alkyl styrene, alkoxy styrene, and halogenated styrene.

Crotonic esters: alkyl crotonates such as butyl crotonate, hexyl crotonate, and glycerol monocrotonate.

Furthermore, dialkyl itaconates, dialkyl esters or monoalkyl esters of maleic acid or fumaric acid, crotonic acid, itaconic acid, maleic anhydride, maleimide, acrylonitrile, methacrylonitrile, maleylonitrile, and so on can be also used. Additionally, in general, an addition-polymerization unsaturated compound which is capable of copolymerization with a polymer that contains at least 1 or more hydroxyl groups, which are cross-linking reactive groups, per repeating unit can be used.

The polymer in the composition for forming a gap-filling material of the present invention may be any one of random polymers, block polymers, and graft polymers. It can be synthesized by a method of radical polymerization, anionic polymerization, cationic polymerization, or the like. Furthermore, a variety of forms such as solution polymerization, suspension polymerization, emulsion polymerization, mass polymerization and so on can be used.

The polymer preferably contains at least a repeating unit represented by the Formula (1). In other words, provided that the repeating unit represented by the Formula (1) is indispensable, preferred is a homopolymer or a derivative thereof consisting of the repeating unit represented by the Formula (1) alone, or a copolymer comprised of the repeating unit represented by the Formula (1) and another repeating unit copolymerizable therewith.

More preferable polymer described above may be a homopolymer consisting of the repeating unit of the Formula (1) or a copolymer comprised of the repeating unit represented by the Formula (1); and a repeating unit of a vinyl group that contains an aromatic moiety or a carboxylate ester moiety on a side chain thereof.

The above-mentioned aromatic moiety is, for example, a benzene ring, a benzene ring having a substituent or the like.

Furthermore, the above-mentioned carboxylate ester moiety is ester such as methyl, ethyl, propyl, butyl, hexyl, hydroxymethyl, 2-hydroxyethyl or 3-hydroxypropyl.

More specifically, the polymer to be used in the composition for forming a gap-filling material of the present invention may be preferably a homopolymer comprised of a repeating unit represented by the Formula (2) or (3), or a copolymer comprised of a repeating unit represented by the formula (2) and a repeating unit represented by the Formulas (4) to (7).

The repeating unit represented by the Formula (2) is p-vinylphenol, and a homopolymer obtainable by the polymerization of such a repeating unit can be yielded by a conventional method. For instance, it can be obtained by streaming a solution prepared by dissolving p-hydroxystyrene monomer in propylene glycol (manufactured by LANCASTER Co., Ltd.) with nitrogen for 30 minutes, followed by addition of azobisisobutyronitrile (AIBN, manufactured by JUNSEI CHEMICAL Co., Ltd.) as a polymerization initiator while holding the reaction solution at 70° C., and stirring for 48 hours in a nitrogen atmosphere. A reactant can be collected as powder by reprecipitating it in one litter of distilled water. The weight-average molecular weight of this polymer is 1000 to 100000, preferably 1000 to 60000, further preferably 1000 to 30000. In addition, such a polymer is also commercially available.

The homopolymer comprised of the repeating unit represented by the Formula (3) is one in which a hydrogen atom at an ortho position and/or a meta position of the benzene ring of p-vinylphenol is substituted with one and a half bromine atoms in average per one unit of p-vinylphenol. The methods for obtaining the polymer include a method of brominating a homopolymer comprised of the repeating unit represented by the Formula (2). For instance, it can be obtained by dissolving the homopolymer comprised of the repeating unit represented by the Formula (2) in carbon tetrachloride or carbon bisulfide, followed by streaming the solution with nitrogen for 30 minutes, adding bromine in the solution at a room temperature, and stirring for 5 hours. A reactant can be collected as powder by reprecipitating it in one liter of distilled water. The weight-average molecular weight of this polymer is 1000 to 100000, preferably 1000 to 60000, further preferably 1000 to 30000. In addition, such a polymer can be also commercially available.

In the copolymer comprised of the repeating unit represented by the Formula (2) and the repeating unit represented by the Formula (4), a p-vinylphenol unit represented by the Formula (2) is a main component thereof containing 20% or more, preferably 20% to 80% of the repeating unit based on the total number of repeating units in the copolymer. In addition, for example, such a copolymer can be obtained by dissolving commercially-available p-hydroxystyrene monomer and styrene monomer in propylene glycol, followed by streaming the reaction solution with nitrogen for 30 minutes, adding azobisisobutyronitrile (AIBN) as a polymerization initiator, and stirring for 48 hours in a nitrogen atmosphere while maintaining the reaction solution at 70° C. A reactant can be collected as powder by reprecipitating it in one liter of distilled water. The weight-average molecular weight of this polymer is 1000 to 100000, preferably 1000 to 60000, further preferably 1000 to 30000. In addition, such a polymer can be also commercially available.

In the copolymer comprised of the repeating unit represented by the Formula (2) and the repeating unit represented by the Formula (5), a p-vinylphenol unit is a main component thereof containing 20% or more, preferably 20% to 80% of the repeating unit based on the total number of repeating units in the copolymer. In addition, for example, such a copolymer can be obtained by dissolving commercially-available p-hydroxystyrene monomer and methyl methacrylate in propylene glycol, followed by streaming the reaction solution with nitrogen for 30 minutes, adding azobisisobutyronitrile (AIBN) as a polymerization initiator, and stirring for 48 hours in a nitrogen atmosphere while maintaining the reaction solution at 70° C. A reactant can be collected as powder by reprecipitating in one liter of distilled water. The weight-average molecular weight of this polymer is 1000 to 100000, preferably 1000 to 60000, further preferably 1000 to 30000. In addition, such a polymer can be also commercially available.

In the copolymer comprised of the repeating unit represented by the Formula (2) and the repeating unit represented by the Formula (6), a p-vinylphenol unit represented by the Formula (2) is a main component thereof containing 20% or more, preferably 20% to 80% of the repeating unit based on the total number of repeating units in the copolymer. In addition, for example, such a copolymer can be obtained by dissolving commercially-available p-hydroxystyrene monomer and 2-hydroxyethyl methacrylate in propylene glycol, followed by streaming the reaction solution with nitrogen for 30 minutes, adding azobisisobutyronitrile (AIBN) as a polymerization initiator, and stirring for 48 hours in a nitrogen atmosphere while maintaining the reaction solution at 70° C. A reactant can be collected as powder by reprecipitating it in one liter of distilled water. The weight-average molecular weight of this polymer is 1000 to 100000, preferably 1000 to 60000, further preferably 1000 to 30000. In addition, such a polymer can be also commercially available.

In the copolymer comprised of the repeating unit represented by the Formula (2) and the repeating unit represented by the formula (7), a p-vinylphenol unit represented by the Formula (2) is a main component thereof containing 20% or more, preferably 20% to 80% of the repeating unit based on the total number of repeating units in the copolymer. In addition, for example, such a copolymer can be obtained by dissolving commercially-available p-hydroxystyrene monomer and butyl methacrylate in propylene glycol, followed by streaming the reaction solution with nitrogen for 30 minutes, adding azobisisobutyronitrile (AIBN) as a polymerization initiator, and stirring for 48 hours in a nitrogen atmosphere while maintaining the reaction solution at 70° C. A reactant can be collected as powder by reprecipitating it in one liter of distilled water. The weight-average molecular weight of this polymer is 1000 to 100000, preferably 1000 to 60000, further preferably 1000 to 30000. In addition, such a polymer can be also commercially available.

As a polymer to be used in the composition for forming a gap-filling material for lithography of the present invention, poly p-vinylphenol, bromide of poly p-vinylphenol, copolymer of p-vinylphenol and styrene, copolymer of p-vinylphenol and methyl methacrylate, copolymer of p-vinylphenol and 2-hydroxyethyl methacrylate, and copolymer of p-vinylphenol and butyl acrylate are preferable. Each of these polymers has a glass transition temperature of 100 to 170° C.

The composition for forming a gap-filling material for lithography of the present invention is allowed to contain a cross-linking agent having at least two cross-linking forming functional groups. The cross-linking agents include melamines, substituted ureas, polymers that contain epoxy groups and so on. Among them, a preferable compound is methoxymethylated glycoluril, methoxymethylated melamine, or the like, and a more preferable compound is tetramethoxymethyl glycoluril or hexamethoxymethylol melamine. Even though the addition amount of the cross-linking agent varies depending on the application solvent to be used, the base substrate to be used, the desired viscosity of the solution, the desired shape of the coating, and so on, it is 0.001 to 20 parts by weight, preferably 0.01 to 10 parts by weight, further preferably 0.1 to 5.0 parts by weight per 100 parts by weight of the whole composition.

The composition for forming a gap-filling material for lithography of the present invention is allowed to contain a cross-linking catalyst. The cross-linking catalysts include compounds capable of regulating the progression of a crosslinking reaction, such as a compound that generates an acid by heat and a compound that generates an acid by light. Among them, preferable compounds are a p-toluenesulfonic acid, a pyridium p-toluenesulfonic acid and so on. Even though the addition amount of the cross-linking catalyst varies depending on the application solvent to be used, the ground substrate to be used, the desired viscosity of the solution, the desired shape of the coating, and so on, it is 0.01 to 30 parts by weight, preferably 0.1 to 30 parts by weight, further preferably 0.5 to 20 parts by weight per 100 parts by weight of the addition amount of the cross-linking agent.

In the composition for forming gap-filling material for lithography of the present invention, the solvents which can be used for dissolving the polymer include ethylene glycol monomethylether, ethylene glycol monoethyl ether, methyl cellosolve acetate, ethyl cellosolve acetate, diethylene glycol monomethylether, diethylene glycol monoethyl ether, diethylene glycol monobutyl ether, propylene glycol, propylene glycol monomethylether, propylene glycol monoethyl ether, propylene glycol monobutyl ether, propylene glycol monomethylether acetate, propylene glycol propyl ether acetate, toluene, xylene, methylethyl ketone, cyclopentanone, cyclohexanone, ethyl 2-hydroxypropionate, ethyl 2-hydroxy-2-methyl propionate, ethyl ethoxyacetate, ethyl hydroxyacetate, methyl 2-hydroxy-3-methylbutanate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, cyclohexanone, and so on. These organic solvents may be used solely or may be used as a combination of two or more of them.

The solvent to be used in a polymer solution of the composition for forming gap-filling material for lithography of the present invention may preferably contain at least a solvent (s) having a boiling point higher than a glass transition temperature of the above-mentioned polymer. Specifically, the solvent (s) may preferably have a boiling point 10° C. or more higher than the glass transition temperature of the polymer. In addition, considering the temperature of drying or baking to be performed after the application of the composition for forming gap-filling material of the present invention to the substrate, the boiling points of these solvents may preferably be in the range of 145° C. to 220° C. Furthermore, it is preferable that the vapor pressure of the solvent is 933 Pa (=7 mmHg) or less at 20° C.

The solvents (s) that satisfy these conditions include propylene glycol monomethylether, propylene glycol monobutyl ether, butyl lactate, diethylene glycol monomethylether, cyclohexanone, propylene glycol monomethylether acetate and so on. Among them, butyl lactate, propylene glycol monobutyl ether, propylene glycol monomethylether acetate, cyclohexanone, diethylene glycol monomethylether, or any mixture thereof is preferable.

In addition to the above-mentioned components, the composition for forming a gap-filling material for lithography of the present invention may further contain a rheology adjusting agent, a co-adhesive agent, a surfactant and so on if required.

The rheology adjusting agent is added to improve the flow properties of the composition for forming gap-filling material for lithography. Particularly, in the step of baking, it is added for the purpose of improving the filling property of the composition for forming a gap-filling material for lithography into the inside of the hole. Specifically, the rheology adjustor include phthalic acid derivatives of dimethyl phthalate, diethyl phthalate, diisobutyl phthalic acid, dihexyl phthalate, and butyl isodecyl phthalate, adipate derivatives such as dinormalbutyl adipate, diisobutyl adipate, diisooctyl adipate and octyidecyl adipate, maleic acid derivatives such as dinormalbutyl malate, diethyl malate and dinonyl malate, oleic acid derivatives such as methyl oleate, butyl oleate and tetrahydrofurfuryl oleate, or stearic acid derivatives such as normal butyl stearate and glyceryl stearate. These rheology adjusting agents may be normally compounded in the proportions of less than 30 parts by weight based on 100 parts by weight of the composition for forming a gap-filling material for lithography.

The co-adhesive agent is added to improve the adhesion between the substrate or resist and the composition for forming gap-filling material for lithography and to prevent the resist pattern collapse, especially in the development. Specifically, the co-adhesive agents include chlorosilanes such as trimethyl chlorosilane, dimethylvinyl chlorosilane, methyldiphenyl chlorosilane, and chloromethyl dimethyl chlorosilane and so on, alkoxy silanes such as trimethyl methoxy silane, dimethyl diethoxy silane, methyl dimethoxy silane, dimethyl vinylethoxy silane, diphenyl dimethoxy silane, phenyl triethoxy silane and so on, silazanes such as hexamethyl disilazane, N,N'-bis(trimethylsilane) urea, dimethyl trimethylsilyl amine, trimethylsilyl imidazole and so on, silanes such as vinyl trichlorosilane, γ-chloropropyl trimethoxy silane, γ-aminopropyl triethoxy silane, γ-glycidoxypropyl trimethoxy silane and so on, heterocyclic compounds such as benzotriazole, benzoimidazole, indazole, imidazole, 2-mercaptobenzoimidazole, 2-mercaptobenzothiazole, 2-mercaptobenzoxazole, urazole, thiouracil, mercaptoimidazole, mercaptopyrimidine and so on, urea compounds such as 1,1-dimethylurea, 1,3-dimethylurea and so on or thiourea compounds. These co-adhesive agents may be normally compounded in the proportions of less than 5 parts by weight, preferably less than 2 parts by weight based on 100 parts by weight of the total composition for forming a gap-filling material for lithography.

In the composition for forming a gap-filling material for lithography of the present invention, a surfactant may be compounded to prevent the generation of pin hole, striation or the like and to further improve thickness uniformity of the various location on the substrate. The surfactants include, for example, nonionic surfactants such as polyoxyethylene alkyl ethers including polyoxyethylene lauryl ether, polyoxyethylene stearyl ether, polyoxyethylene cetyl ether, polyoxyethylene oleyl ether and so on, polyoxyethylene alkylallyl ethers including polyoxyethylene octylphenol ether, polyoxyethylene nonylphenol ether, and so on, polyoxyethylene/polyoxypropylene block copolymers, sorbitan fatty acid esters including sorbitan monolaurate, sorbitan monopalmitate, sorbitan monostearate, sorbitan monooleate, sorbitan trioleate, sorbitan tristearate, and so on, polyoxyethylene sorbitan fatty acid esters including polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, and so on; fluorine-based surfactants such as Etop EF301, EF303, and EF352 (manufactured by Tochem Products K. K.), Megafac F171, F173, R-08 and R-30 (manufactured by Dainippon Ink and Chemicals INC.), Florad FC430 and FC431 (manufactured by Sumitomo 3M K. K.), Asahi-guard AG710, Surflon S-382, SC101, SC102, SC103, SC104, SC105 and SC106 (Asahi Glass Co., Ltd.) and so on; and organosiloxane polymer KP341 (Shin-etsu Chemical Co., Ltd.); and so on. Amount of these surfactants to be compounded is normally less than 0.2 parts by weight, preferably less than 0.1 parts by weight based on 100 parts by weight of the total composition of the present invention. These surfactants may be added solely or may be added as any combination of two or more surfactants.

Either of negative- or positive-type resist can be used as resist coated over the top layer of the composition for forming a gap-filling material for lithography of the present invention. The resists include a positive-type resist including a novolac resin or 1,2-naphthoquinone diazidesulfonic acid ester, a chemical amplification type resist comprised of a photo-acid generator and a binder having a group which can increase alkaline dissolving speed by the decomposition with an acid, a chemical amplification type resist comprised of an alkali-soluble binder, a photo-acid generator and a low-molecular weight compound which can increase decomposition with an acid to increase alkaline dissolving speed of resist, a chemical amplification type resist comprised of a photo-acid generator, a binder having a group which can increase the alkaline dissolving speed by the decomposition with an acid and a low-molecular weight compound which can increase the alkaline dissolving speed of the resist by the decomposition with an acid and the like, for example, including APEX-E (manufactured by Shipley Company).

The developers which can be used for the positive type photoresist coated over a gap-filling material for lithography formed with the use of the composition for forming a gap-filling material for lithography of the present invention may be alkaline aqueous solutions of: inorganic alkalines such as sodium hydroxide, potassium hydroxide, sodium carbonate, sodium silicate, sodium metasilicate, aqueous ammonia and so on; primary amines such as ethyl amine, n-propyl amine and so on; secondary amines such as diethyl amine, dinormalbutyl amine and so on; tertiary amines such as triethyl amine, methyl diethyl amine and so on; alcohol amines such as dimethylethanol amine, triethanol amine and so on; quaternary ammonium salts such as tetramethyl ammonium hydroxide, tetraethyl ammonium hydroxide, choline and so on; cyclic amines such as pyrrole, piperidine and so on; and so on. Furthermore, alcohols such as isopropyl alcohol, anionic surfactant and the like, and so on may be used by adding proper quantity thereof to the alkaline aqueous solution. Among them, a preferable developer is the quaternary ammonium salt, more preferably tetramethyl ammonium hydroxide and choline.

In the present invention, a semiconductor device can be manufactured by forming an integrated circuit element by transferring an image on a substrate by a method comprising:
- a step (A) in which the above-mentioned composition for forming a gap-filling material is applied to a substrate having holes with an aspect ratio of one or above, where the aspect ratio is defined as height/diameter, and is then dried to form a planarized filling layer on the substrate;
- a step (B) in which the resist is applied and dried; and
- a step (C) in which an exposure, a development, and an etching are performed. Then, a bottom anti-reflective coating can be formed before or after the formation of the filling layer using the composition for forming a gap-filling material in the above step (A).

The method for manufacturing a semiconductor device of the present invention will be more concretely described. At first, a composition for forming a gap-filling material for lithography is applied to a substrate to be used in the production of a precision integrated circuit element (e.g., a transparent substrate such as silicon/silicon dioxide coating, silicon nitride coating, glass substrate, ITO substrate and so on) by an appropriate application method such as one using a spinner or a coater, followed by baking and curing to obtain a gap filling material. Preferably, here, the gap filling material may have a film thickness of 0.01 to 3.0 μm and the baking conditions may be at 60° C. to 250° C. for 0.3 to 120 minutes. Subsequently, a bottom anti-reflective coating is coated and is then baked and cured to form a bottom anti-reflective coating. Furthermore, a photoresist is applied and is then exposed through a predetermined mask, followed by developing, rinsing and drying to produce a semiconductor device. If required, two stages of baking with different temperatures and post exposure baking (PEB) may be performed.

In another method for manufacturing a semiconductor device, a composition for forming a gap-filling material for lithography can be obtained by forming a bottom anti-reflective coating made of an inorganic material on a substrate to be used in the production of a precision integrated circuit element (e.g., a transparent substrate such as silicon/silicon dioxide coating, silicon nitride coating, glass substrate, and ITO substrate) by, for example, the CDV method, and applying a composition for forming a gap-filling material for lithography thereon by an appropriate application method such as one using a spinner or a coater, followed by baking and curing to obtain a gap-filling material for lithography. Preferably, here, the gap filling material may have a film thickness of 0.01 to 3.0 μm and the baking conditions may be at 60° C. to 250° C. for 0.3 to 120 minutes. Subsequently, a photoresist is coated and is then exposed through a predetermined mask, followed by developing, rinsing, and drying to produce a superior semiconductor device. If required, two stages of baking with different temperatures and post exposure baking may be performed.

A substrate having holes can be favorably planarized by means of the composition for forming a gap-filling material of the present invention. In the polymer to be used in the composition for forming a gap-filling material of the present invention, there is introduced no aromatic group having a light-absorbency such as is present in the polymer to be used in the composition for forming a bottom anti-reflective coating, thus realizing a larger dry etching rate. Thus, it has a larger dry-etching ability as compared with that of the photoresist to be coated on the upper layer and, as the case may be, as compared with that of the bottom anti-reflective coating. Therefore, a film thickness of the resist can be reduced and a fine image can be transferred to the substrate.

As a method for attaining further enhanced planarizing ability of the composition for forming a gap-filling material for lithography of the present invention, there is a method in which the glass transfer temperature (Tg) for a polymer to be used is lowered a little to provide it with a fluidity at the time of baking while making it become insoluble to the resist solvent after complete solidification. For this purpose, there is conceived an idea of slightly decreasing the cross-linking points. For attaining such a function of planarizing, there may be conceived a various kinds of methods including those concerned with the polymerization degree of the polymer, the concentration of the polymer having cross-linking points in the composition, the percentage of the polymers having cross-linking points in the total solids, the selection of additive components and so on.

Hereinafter, the present invention will be described in detail according to Examples thereof. However, the present invention is not limited to these Examples.

SYNTHETIC EXAMPLE 1

In 300 g of a solution (manufactured by LANCASTER Co., Ltd.) in which p-vinyl phenol monomer with a solid content concentration of 10% by weight was dissolved in a propylene glycol, 11 g of styrene monomer (Tokyo Kasei Kogyo Co., Ltd.) was dissolved. Then, the solution was streamed with nitrogen for 30 minutes. 0.7 g of azobisisobutyronitrile (AIBN, manufactured by Junsei Chemical Co., Ltd.) as a polymerization initiator was added while holding the reaction solution at 70° C., and was then stirred in a nitrogen atmosphere. A reactant was collected by re-precipitating in one litter of distilled water. The resulting sediment was filtrated and was then dried to obtain powder of the polymer. The resulting polymer was subjected to a GPC analysis. As a result, the weight-average molecular weight of the resulting polymer was 3000 in terms of the standard polystyrene (60% yield).

The structure of the resulting polymer was of a copolymerization of p-vinylphenol and styrene at a molar ratio of 70:30.

Furthermore, 1 g of the obtained polymer was dissolved in 3 g of propylene glycol monomethylether to prepare 25% by weight of a solution. Then, the viscosity of the solution at 25° C. was 15 mPas as a result of the measurement using an E-type rotational viscometer.

The coefficient H defined as [logarithmic change in viscosity (mPas)]/[change in solid content concentration (% by weight)] was 0.041 under the measurement conditions of a solvent temperature of 25° C. and a solid content concentration of 8.3 to 25% by weight.

SYNTHETIC EXAMPLE 2

In 100 g of a solution (manufactured by LANCASTER Co., Ltd.) in which p-vinyl phenol monomer with a solid content concentration of 10% by weight was dissolved in a propylene glycol, 8.5 g of methyl methacrylate (Junsei Chemical Co., Ltd.) was dissolved. Then, the solution was streamed with nitrogen for 30 minutes. 0.7 g of azobisisobutyronitrile (AIBN, manufactured by JUNSEI CHEMICAL Co., Ltd.) was added while holding the reaction solution at 70° C., and was then stirred in a nitrogen atmosphere. A reactant was collected by re-precipitating in one litter of distilled water. The resulting sediment was filtrated and was then dried to obtain powder of the polymer. The resulting polymer was subjected to a GPC analysis. As a result, the weight-average molecular weight of the resulting polymer was 5300 in terms of the standard polystyrene.

The structure of the resulting polymer was of a copolymerization of p-vinylphenol and methyl methacrylate at a molar ratio of 49:51. The glass transition temperature of the polymer was 135° C.

Furthermore, 1 g of the obtained polymer was dissolved in 3 g of propylene glycol monomethylether to prepare a 25 w/t % solution. Then, the viscosity of the solution at 25° C. was 20 mPas as a result of the measurement using an E-type rotational viscometer.

The coefficient H defined as [logarithmic change in viscosity (mPas)]/[change in solid content concentration (% by weight)] was 0.046 under the measurement conditions of a solvent temperature of 25° C. and a solid content concentration of 8.3 to 25% by weight.

SYNTHETIC EXAMPLE 3

20 g of acrylic acid (manufactured by JUNSEI CHEMICAL Co., Ltd.) was dissolved in 100 g of propylene glycol monomethylether, followed by streaming the solution with nitrogen for 30 minutes. While holding the reaction solution at 60° C., 0.2 g of azobisisobutyronitrile (AIBN, manufactured by Junsei Chemical Co., Ltd.) as a polymerization initiator and 0.04 g of 1-dodecanethiol (manufactured by Kanto Kagaku Ltd.) as a chain transfer agent were added and were then stirred in a nitrogen atmosphere. After stirring for 24 hours, 0.03 g of 4-methoxyphenol (manufactured by Tokyo Kasei Kogyo Co., Ltd.) was added as a polymerization terminator. A sediment obtained by re-precipitating the reaction product in 1 liter of distilled water was filtrated and dried to obtain powder of the polymer. The resulting polymer was subjected to a GPC analysis. As a result, the weight-average molecular weight of the polymer was 19000 in terms of the standard polystyrene.

The resulting polymer was polyacrylic acid.

Furthermore, 1 g of the obtained polyacrylic acid was dissolved in 3 g of propylene glycol monomethylether to prepare a 25 w/t % solution thereof. The viscosity of the solution measured by an E-type rotational viscometer was 98 mPa·s at 25° C.

The coefficient H defined as [logarithmic change in viscosity (mpas)]/[change in solid content concentration (% by weight)] was 0.069 under the measurement conditions of a solvent temperature of 25° C. and a solid content concentration of 8.3 to 25% by weight.

SYNTHETIC EXAMPLE 4

30 g of hydroxypropyl methacrylate (manufactured by Junsei Chemical Co., Ltd.) was dissolved in 120 g of propylene glycol monomethylether, followed by streaming the solution with nitrogen for 30 minutes. While holding the reaction solution at 70° C., 0.03 g of azobisisobutyronitrile (AIBN, manufactured by Junsei Chemical Co., Ltd.) was added as a polymerization initiator and was then stirred in a nitrogen atmosphere. After stirring for 24 hours, 0.04 g of 4-methoxyphenol (manufactured by Tokyo Kasei Kogyo Co., Ltd.) was added as a polymerization terminator. In the solution, the solid content was 23%. Then, the solution was re-precipitated in distilled water to obtain a sediment. After that, the sediment was filtrated and dried to obtain fine particles of the polymer. The resulting polymer was subjected to a GPC analysis. As a result, the weight-average molecular weight of the polymer was 130000 in terms of the standard polystyrene.

The resulting polymer was polyhydroxypropyl methacrylate.

Furthermore, 1 g of the obtained polyhydroxypropyl methacrylate was dissolved in 3 g of propylene glycol monomethylether to prepare a 25 w/t % solution thereof. The viscosity of the solution measured by an E-type rotational viscometer was 225 mPas at 25° C.

The coefficient H defined as [logarithmic change in viscosity (mPas)]/[change in solid content concentration (% by weight)] was 0.079 under the measurement conditions of a solvent temperature of 25° C. and a solid content concentration of 8.3 to 25% by weight.

EXAMPLE 1

20 g of a copolymer of p-vinylphenol and styrene obtained in Synthetic Example 1 was mixed with 3.0 g of tetramethoxymethyl glycoluril and 0.02 g of para-toluenesulfonic acid and was then dissolved in a solvent comprised of 173 g of propylene glycol monomethylether and 75 g of propylene glycol monomethylether acetate to give an 8.5% solution thereof. The given solution was filtered through a micro-filter made by polyethylene with a pore size of 0.05 μm to prepare a composition for forming a gap-filling material for lithography.

EXAMPLE 2

20 g of a copolymer of p-vinylphenol and styrene obtained in Synthetic Example 1 was mixed with 4.0 g of hexamethoxymethylol melamine and 0.04 g of para-toluenesulfonic acid and was then dissolved in a solvent comprised of 190 g of propylene glycol monomethylether and 83 g of propylene glycol monomethylether acetate to give an 8.1% solution thereof. The given solution was filtered through a micro-filter made by polyethylene with a pore size of 0.05 μm to prepare a composition for forming a gap-filling material for lithography.

EXAMPLE 3

40 g of a commercially-available bromide of poly p-vinylphenol (MARUKA LYNCUR MB, manufactured by Maruzen Petrochemical Co., Ltd.) comprising a repeating unit represented by the Formula (3) was mixed with 4.0 g of tetramethoxymethyl glycoluril and 0.02 g of para-toluenesulfonic acid and was then dissolved in a solvent comprised of 229 g of propylene glycol monomethylether and 100 g of propylene glycol monomethylether acetate to give an 11.8 w/t % solution thereof. The given solution was filtered through a micro-filter made by polyethylene with a pore size of 0.05 μm to prepare a composition for forming a gap-filling material. The resulting composition was subjected to a GPC analysis and the weight-average molecular weight thereof was 6000 in terms of the standard polystyrene.

Subsequently, 1 g of MARUKA LYNCUR MB was dissolved in 3 g of propylene glycol monomethylether to prepare a 25 w/t % solution thereof. The viscosity of the solution measured by an E-type rotational viscometer was 7.6 mPas at 25° C.

The coefficient H defined as [logarithmic change in viscosity (mPas)]/[change in solid content concentration (% by weight)] was 0.029 under the measurement conditions of a solvent temperature of 25° C. and a solid content concentration of 8.3 to 25% by weight.

EXAMPLE 4

40 g of a commercially-available bromide of poly para-vinylphenol (MARUKA LYNCUR MB, manufactured by Maruzen Petrochemical Co., Ltd.) comprising a repeating unit represented by the Formula (3) was mixed with 4.0 g of hexamethoxymethylol melamine and 0.02 g of para-toluenesulfonic acid and was then dissolved in a solvent comprised of 234 g of propylene glycol monomethylether and 102 g of propylene glycol monomethylether acetate to give an 11.8 w/t % solution thereof. The given solution was filtered through a micro-filter made by polyethylene with a pore diameter of 0.05 μm to prepare a composition for forming a gap-filling material for lithography. The resulting composition was subjected to a GPC analysis and the weight-average molecular weight thereof was 6000 in terms of the standard polystyrene.

EXAMPLE 5

20 g of a copolymer of p-vinylphenol and methyl methacrylate obtained in Synthetic Example 2 was mixed with 4.0 g of tetramethoxymethyl glycoluril and 0.08 g of para-toluenesulfonic acid and was then dissolved in a solvent comprised of 186.0 g of propylene glycol monomethylether and 75 g of propylene glycol monomethylether acetate to give an 8.5 w/t % solution thereof. The given solution was filtered through a micro-filter made by polyethylene with a pore size of 0.05 μm to prepare a composition for forming a gap-filling material for lithography.

EXAMPLE 6

40 g of novolac type phenol resin comprising a repeating unit represented by the following Formula (8) (RESITOP PSM-4326, manufactured by Gunei Chemical Industry Co., Ltd.) was mixed with 14.1 g of tetramethoxymethyl glycoluril and 1.4 g of para-toluenesulfonic acid and was then dissolved in a solvent comprised of 371 g of propylene glycol monomethylether and 159 g of propylene glycol monomethylether acetate to give a 9.5 w/t % solution thereof. The given solution was filtered through a polyethylene micro-filter of 0.05 μm to prepare a composition for forming a gap-filling material for lithography.

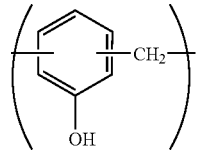

Formula (8)

Subsequently, 1 g of RESITOP PSM-4326 was dissolved in 3 g of propylene glycol monomethylether to prepare a 25 w/t % solution thereof. The viscosity of the solution measured by an E-type rotational viscometer was 31.9 mPas at 25° C.

The coefficient H defined as [logarithmic change in viscosity (mPas)]/[change in solid content concentration (% by weight)] was 0.053 under the measurement conditions of a solvent temperature of 25° C. and a solid content concentration of 8.3 to 25% by weight.

EXAMPLE 7

20 g of a copolymer of p-vinylphenol and methyl methacrylate obtained in Synthetic Example 2 was mixed with 4.0 g of tetramethoxymethyl glycoluril and 0.08 g of para-toluenesulfonic acid and was then dissolved in a solvent comprised of 38.5 g of propylene glycol monomethylether (boiling point: 121° C.) and 38.5 g of propylene glycol monobutyl ether (boiling point: 170.1° C.) to give an 8.5 w/t % solution thereof. The given solution was filtered through a micro-filter made by polyethylene of 0.05 μm to prepare a composition for forming a gap-filling material for lithography.

EXAMPLE 8

20 g of a copolymer of p-vinylphenol and methyl methacrylate obtained in Synthetic Example 2 was mixed with 4.0 g of tetramethoxymethyl glycoluril and 0.08 g of para-toluenesulfonic acid and was then dissolved in a solvent comprised of 38.5 g of propylene glycol monomethylether and 38.5 g of butyl lactate (boiling point: 187° C.) to give an 8.5 w/t % solution thereof. The given solution was filtered through a micro-filter made by polyethylene with a pore-size of 0.05 μm to prepare a composition for forming a gap-filling material for lithography.

EXAMPLE 9

20 g of a copolymer of p-vinylphenol and methyl methacrylate obtained in Synthetic Example 2 was mixed with 4.0 g of tetramethoxymethyl glycoluril and 0.08 g of para-toluenesulfonic acid and was then dissolved in a solvent comprised of 38.5 g of propylene glycol monomethylether and 38.5 g of diethylene glycol monomethylether (boiling point: 194.2° C.) to give an 8.5 w/t % solution thereof. The given solution was filtered through a micro-filter made by polyethylene with a pore size of 0.05 µm to prepare a composition for forming a gap-filling material for lithography.

EXAMPLE 10

20 g of a copolymer of p-vinylphenol and methyl methacrylate obtained in Synthetic Example 2 was mixed with 4.0 g of tetramethoxymethyl glycoluril and 0.08 g of para-toluenesulfonic acid and was then dissolved in a solvent comprised of 38.5 g of propylene glycol monomethylether and 38.5 g of cyclohexanone (boiling point: 155.7° C.) to give an 8.5 w/t % solution thereof. The given solution was filtered through a micro-filter made by polyethylene with a pore size of 0.05 µm to prepare a composition for forming a gap-filling material for lithography.

EXAMPLE 11

20 g of a copolymer of p-vinylphenol and methyl methacrylate obtained in Synthetic Example 2 was mixed with 4.0 g of tetramethoxymethyl glycoluril and 0.08 g of para-toluenesulfonic acid and was then dissolved in a solvent comprised of 38.5 g of propylene glycol monomethylether and 38.5 g of propylene glycol monomethylether acetate (boiling point: 146° C.) to give a 8.5 w/t % solution thereof. The given solution was filtered through a micro-filter made by polyethylene with a pore size of 0.05 µm to prepare a composition for forming a gap-filling material for lithography.

COMPARATIVE EXAMPLE 1

40 g of a commercially-available polyethylene glycol (Polyethylene Glycol 2000 manufactured by Junsei Chemical Co., Ltd.) was mixed with 14.2 g of tetramethoxymethyl glycoluril and 1.42 g of para-toluenesulfonic acid and was then dissolved in a solvent comprised of 457 g of propylene glycol monomethylether and 229 g of propylene glycol monomethylether acetate to give a 6.8% solution thereof. The give solution was filtered through a micro-filter made by polyethylene with a pore size of 0.05 µm to prepare a composition for forming a gap-filling material for lithography.

COMPARATIVE EXAMPLE 2

40 g of polyacrylic acid obtained in Synthetic Example 3 was mixed with 14.1 g of tetramethoxymethyl glycoluril and 1.4 g of para-toluenesulfonic acid and was then dissolved in a solvent comprised of 371 g of propylene glycol monomethylether and 159 g of propylene glycol monomethylether acetate to give a 9.5 w/t % solution thereof. The given solution was filtered through a micro-filter made by polyethylene with a pore size of 0.05 µm to prepare a composition for forming a gap-filling material for lithography.

COMPARATIVE EXAMPLE 3

40 g of polyhydroxypropyl methacrylate obtained in Synthetic Example 4 was mixed with 14.1 g of tetramethoxymethyl glycoluril and 1.4 g of para-toluenesulfonic acid and was then dissolved in a solvent comprised of 371 g of propylene glycol monomethylether and 159 g of propylene glycol monomethylether acetate to give a 9.5 w/t % solution thereof. The given solution was filtered through a micro-filter made by polyethylene with a pore size of 0.05 µm to prepare a composition for forming a gap-filling material for lithography.

COMPARATIVE EXAMPLE 4

20 g of a copolymer of p-vinylphenol and methyl methacrylate obtained in Synthetic Example 2 was mixed with 4.0 g of tetramethoxymethyl glycoluril and 0.08 g of para-toluenesulfonic acid and was then dissolved in a solvent comprised of 38.5 g of propylene glycol monomethylether and 38.5 g of tetrahydrofuran (boiling point: 65° C.) to provide an 8.5 w/t % solution thereof. The given solution was filtered through a micro-filter made of polyethylene with a pore size of 0.05 µm to prepare a composition for forming a gap-filling material for lithography.

COMPARATIVE EXAMPLE 5

20 g of a copolymer of p-vinylphenol and methyl methacrylate obtained in Synthetic Example 2 was mixed with 4.0 g of tetramethoxymethyl glycoluril and 0.08 g of para-toluenesulfonic acid and was then dissolved in a solvent comprised of 38.5 g of propylene glycol monomethylether and 38.5 g of ethylene glycol dimethylether (boiling point: 82.5° C.) to provide an 8.5 w/t % solution thereof. The given solution was filtered through a micro-filter made of polyethylene with a pore size of 0.05 µm to prepare a composition for forming a gap-filling material for lithography.

TEST EXAMPLE 1

The compositions for forming a gap-filling material for lithography obtained in Examples 1 to 11 and Comparative Examples 1 to 5 were applied over the respective silicon wafers by a spinner and were then heated on a hot plate at 205° C. for 1 minute to form their respective gap-filling materials for lithography (0.22 µm in film thickness). The gap-filling materials for lithography were dipped in solvents to be used for resist, for example, ethyl lactate and propylene glycol monomethylether to confirm that they were insoluble in these solvents.

TEST EXAMPLE 2

The compositions for forming a gap-filling material for lithography obtained in Examples 1 to 11 and Comparative Examples 1 to 5 were applied to the respective silicon wafers by a spinner and were then heated on a hot plate at 205° C. for 1 minute to form their respective gap-filling materials for lithography (0.22 µm in film thickness). A commercially-available resist solution (APEX-E, manufactured by Shipley Company) was applied to the top layer of the gap-filling material for lithography by the spinner and was then heated on the hot plate at 90° C. for 1 minute. After exposing the resist, a post-exposure baking was performed at 90° C. for 1.5 minutes. After developing the resist, the film thickness of the gap-filling material for lithography was measured to confirm that there was no intermixing between the gap-filling materials for lithography obtained in Examples 1 to 4 and Comparative Example 1 and the resist layer.

TEST EXAMPLE 3

The compositions for forming a gap-filling material for lithography obtained in Examples 1 to 4 and Comparative Example 1 were applied over the respective silicon wafer substrates having holes (0.25 μm in diameter and 0.9 μm in depth) by a spinner and were then heated on a hot plate at 205° C. for 1 minute to form their respective gap-filling materials for lithography (0.24 μm in film thickness).

Subsequently, a planarizing factor was evaluated by observing the cross-sectional shape of the obtained substrate using a scanning electron microscopy (SEM). The planarizing factor was calculated according to the following equation. A planarizing factor of 100% is obtained when the holes in the substrate are entirely planarized.

Planarizing factor=[1−$a/b$]×100 a: The depth of a recessed portion of the gap-filling material for lithography in the center portion of the hole.

b: The depth of the hole.

The substrate used is a silicon wafer substrate having holes in Iso and Dense patterns as illustrated in FIG. 1. The Iso pattern is one in which the distance from the center of a hole to the center of the adjacent hole is three times larger than the diameter of the hole. Also, the Dense pattern is one in which the distance from the center of a hole to the center of the adjacent hole is equal to the diameter of the hole. The depth of the hole was 0.9 μm and the diameter of the hole was 0.25 μm.

Simultaneously, furthermore, the film thickness of each portion of the substrate formed by the composition for forming a gap-filling material for lithography was measured.

The results were listed in Table 1.

TABLE 1

| | Film thickness (Unit: nm) | | | Planarizing factor (Unit: %) | | |
|---|---|---|---|---|---|---|
| | Iso | Dense | Bias | Iso | Dense | Bias |
| Example 1 | 190 | 80 | 110 | 98 | 93 | 5 |
| Example 2 | 200 | 100 | 100 | 96 | 91 | 5 |
| Example 3 | 180 | 90 | 90 | 98 | 94 | 4 |
| Example 4 | 180 | 100 | 80 | 89 | 81 | 8 |
| Comparative Example 1 | 200 | 80 | 120 | 84 | 53 | 31 |

The planarizing factor of the film obtained by each of the compositions for forming a gap-filling material for lithography of Examples 1 to 4 was larger than that of Comparative Example 1, with particularly excellent planarizing ability in Dense pattern that requires severe conditions. Furthermore, the difference between the film thickness of the Iso portion and that of the Dense portion was small in each of the compositions for forming a gap-filling material for lithography of Examples 1 to 4. This indicates that the compositions for forming a gap-filling material were smoothly poured into a plurality of holes also in the Dense portion in which the number of holes per unit area on the hole substrate (the hole density) is larger than that of the Iso portion. It is considered that this has led to a small difference between the film thickness of the Iso portion and that of the Dense portion and to a large planarizing factor.

TEST EXAMPLE 4

For the respective compositions for forming a gap-filling material for lithography obtained in Examples 1 to 3, 5, and 6 and Comparative Examples 2 and 3, as with Test Example 3, an evaluation was conducted on the planarizing factor of a substrate on which the composition for forming a gap-filling material for lithography was coated. The substrate used was a silicon wafer substrate having holes (0.25 μm in diameter and 0.9 μm in depth) and the film thickness of the gap-filling material was about 0.23 μm.

Figure 2:
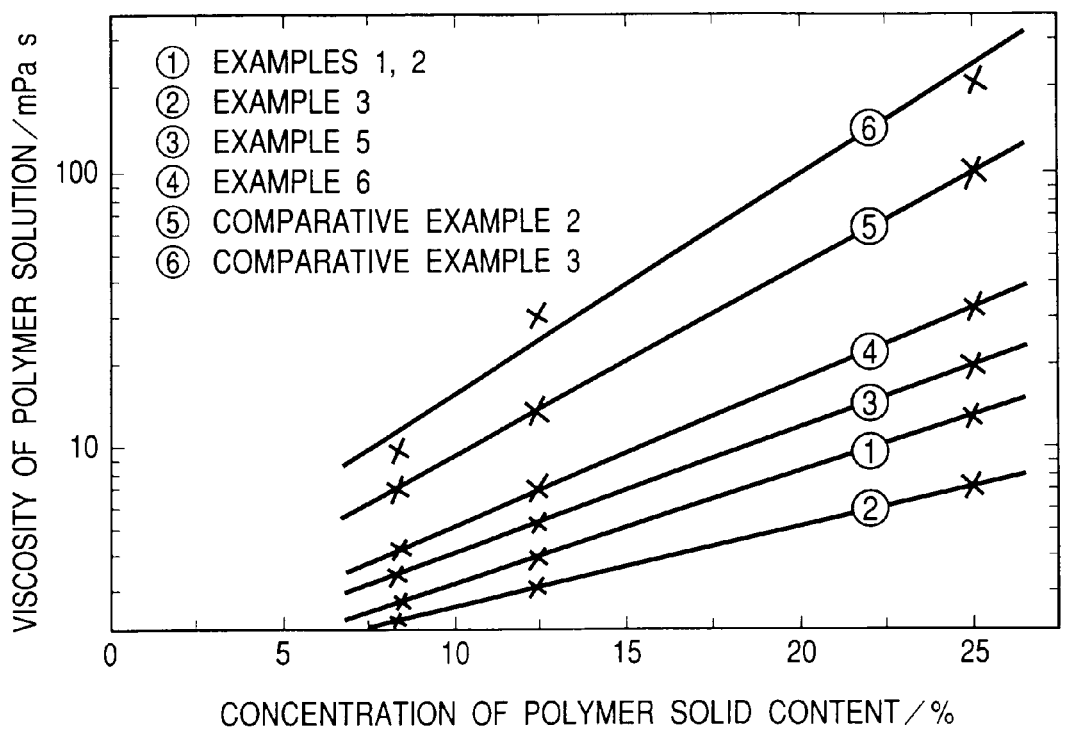
FIG. 2 is a graph that represents a relationship between a concentration (% by weight) and viscosity (mPas) of a polymer solution used in Examples and Comparative Examples, where concentration values are plotted on the lateral axis and viscosity values measured at 25° C. are plotted in common logarithm on the vertical axis. In the figure, ① is a straight line that denotes a coefficient H of Example 1 and Example 2, ② is a straight line that denotes the coefficient H of Example 3, ③ is a straight line that denotes the coefficient H of Example 5, ④ is a straight line that denotes the coefficient H of Example 6, ⑤ is a straight line that denotes the coefficient H of Comparative Example 2, and ⑥ is a straight line that denotes the coefficient H of Comparative Example 3.

Simultaneously, furthermore, each of the compositions for forming a gap-filling material for lithography was subjected to the measurements of its viscosity (mpas) and coefficient H, where the coefficient H was defined as [logarithmic change in viscosity (mPas)]/[change in solid content concentration (% by weight)] under the measurement conditions in which the temperature of the solution was 25° C. and the solid content concentration was 8.3 to 25% by weight. The manner thereof is shown in FIG. 2.

The results are listed in Table 2.

TABLE 2

| | | Viscosity of the polymer solution | Planarizing factor (Unit: %) | | |
|---|---|---|---|---|---|
| | Coefficient H | (Unit: mPa · s) | Iso | Dense | Bias |
| Example 1 | 0.041 | 15 | 98 | 93 | 5 |
| Example 2 | 0.041 | 15 | 96 | 91 | 5 |
| Example 3 | 0.029 | 8 | 98 | 94 | 4 |
| Example 5 | 0.046 | 21 | 98 | 97 | 1 |
| Example 6 | 0.053 | 32 | 89 | 84 | 5 |
| Comparative Example 2 | 0.069 | 98 | 88 | 72 | 15 |
| Comparative Example 3 | 0.079 | 225 | 82 | 51 | 31 |

The planarizing factor of the film obtained from each of the compositions for forming a gap-filling material for lithography of Examples 1 to 3, 5, and 6 was larger than those of Comparative Examples 2 and 3, and in particular the planarizing ability thereof in the Dense patterns was excellent. It is considered that this is caused by an increase in fluidity of the solution in the steps of spinning and baking as the viscosity of the composition for forming a gap-filling material becomes lower.

TEST EXAMPLE 5

For the respective compositions for forming a gap-filling material for lithography obtained in Examples 7 to 11, and Comparative Examples 4 and 5, as with Test Example 3, an evaluation was conducted on the planarizing factor of a substrate on which the lithographic gap-filler forming composition was coated. The substrate used was a silicon wafer substrate having holes (0.35 μm in diameter and 1.0 μm in depth) and the film thickness of the gap-filling material was about 0.22 μm.

TABLE 3

| | Planarizing factor (Unit: nm) | | |
|---|---|---|---|
| | Iso | Dense | Bias |
| Example 7 | 97 | 94 | 3 |
| Example 8 | 96 | 91 | 5 |
| Example 9 | 97 | 95 | 2 |
| Example 10 | 91 | 73 | 18 |
| Example 11 | 90 | 60 | 30 |
| Comparative Example 4 | 87 | 32 | 55 |
| Comparative Example 5 | 89 | 45 | 44 |

The planarizing factor of the film obtained from the composition for forming a gap-filling material for lithography of each of Examples 7 to 11 was high as compared with that of the film obtained from each of Comparative Examples 4 and 5 and in particular the planarizing ability thereof was excellent in the Dense patterns that requires severe conditions. In each of Comparative Examples 4 and 5, furthermore, the gap-filling-material was adhered along the step in the substrate (a conformal type). In each of Examples 7 to 11, on the other hand, it flows from the vicinity of the hole to the inside of the hole. Therefore, the surface of the substrate covered in accordance with each of Examples 10 to 14 was planarized. In each of Examples 7 to 11, it is considered that the difference in planarizing factor is small as the composition for forming a gap-filling material flows into a plurality of holes with a larger fluidity also in the Dense portion where the number of holes per unit area on the substrate is larger than that of the Iso portion. The reason why the compositions for forming a gap-filling material of Examples 7 to 11 have planarizing factors larger than those of Comparative Examples 4 to 5 is that each of them contains a solvent having a boiling point higher than the glass transition temperature of the polymer or the boiling point of such a solvent is in the range of 145° C. to 220° C.

INDUSTRIAL APPLICABILITY

A gap-filler forming composition of the present invention planarizes the substrate having holes by filling in the irregularities thereof and finds utility in the improvement of uniformity of the film thickness of an applied film such as a photoresist applied on the substrate. It has a high dry etching rate as compared with that of a photoresist layer and it does not cause an intermixing with the photoresist layer. In addition, there is no diffusant into the photoresist at the time of heating and drying. Therefore, a lithographic gap-filler having a high resolution and an excellent dependency on the film thickness of the photoresist can be obtained and an excellent resist-pattern forming process can be provided.

The invention claimed is:

1. A method for applying a composition to a substrate for forming a gap-filling material, wherein the composition comprises a polymer solution comprising a polymer and a solvent and has a coefficient H of 0.046 or less, which is defined as (logarithmic change in viscosity (mPas))/(change in solid content concentration (% by weight)) and a viscosity of 1 to 80 mPas which is measured at a solid content concentration of 25% by weight; a cross-linking agent having at least two cross-linking forming functional groups; and a cross-linking catalyst, wherein the solvent comprises two or more solvents, comprising 20 to 80% by weight of a high boiling point solvent having a boiling point of 145° to 220° C. and having a boiling point that is 10° C. or more higher than a glass transition temperature of the polymer based on the whole solvent, wherein the method comprises:

applying the composition to a substrate having holes with an aspect ratio of 1 or more, which is defined as height/diameter, and drying the composition to form a planarized filling layer on the substrate, and wherein the polymer is a homopolymer comprised of the repeating unit represented by Formula (1)

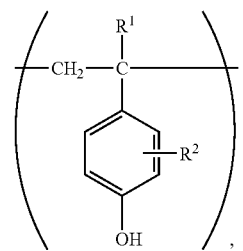

Formula (1)

wherein $R^1$ and $R^2$ each independently represent a hydrogen atom, a methyl group, a fluorine atom, a chlorine atom, a bromine atom or a cyano group, or a copolymer comprised of the repeating unit represented by Formula (1) and a repeating unit which is a vinyl group that contains an aromatic moiety or a carboxylic acid ester moiety on a side chain thereof wherein a weight-average molecular weight of the polymer is from 500 to 30000, wherein the repeating unit represented by Formula (I) is present in an amount of 20% or more based on the total number of repeating units in the polymer.

2. The method according to claim 1, characterized in that the boiling point of the solvent(s) is from 145 to 220° C.

3. The method according to claim 1, characterized in that the solvent(s) is butyl lactate, propylene glycol monobutylether, propylene glycol monomethylether acetate, cyclohexanone, diethylene glycol monomethylether, or any mixture thereof.

4. The method according to claim 1, characterized in that the polymer is poly p-vinylphenol that comprises a repeating unit represented by Formula (2):

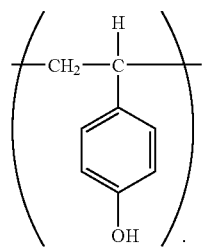

Formula (2)

5. The method according to claim 1, characterized in that the polymer is a bromide of poly p-vinylphenol, which comprises a repeating unit represented by Formula (3):

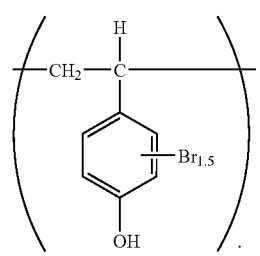

Formula (3)

6. The method according to claim 1, characterized in that the polymer is a copolymer of p-vinylphenol and styrene, which comprises a repeating unit represented by Formula (2):

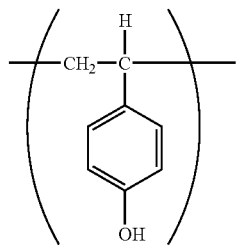

Formula (2)

and a repeating unit represented by Formula (4):

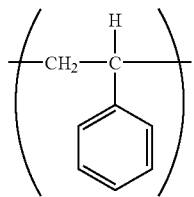

Formula (4)

and in which 20% or more of the repeating unit represented by Formula (2) is contained based on the total number of the repeating units in the polymer.

7. The method according to claim 1, characterized in that the polymer is a copolymer of p-vinylphenol and methyl methacrylate, which comprises a repeating unit represented by Formula (2):

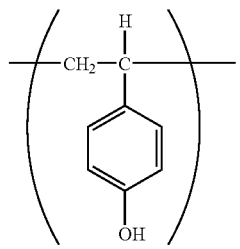

Formula (2)

and a repeating unit represented by Formula (5):

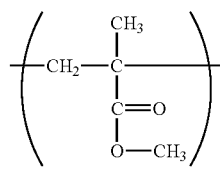

Formula (5)

and in which 20% or more of the repeating unit represented by Formula (2) is contained based on the total number of the repeating units in the polymer.

8. The method according to claim 1, characterized in that the polymer is a copolymer of p-vinylphenol and 2-hydroxyethyl methacrylate, which comprises a repeating unit represented by Formula (2):

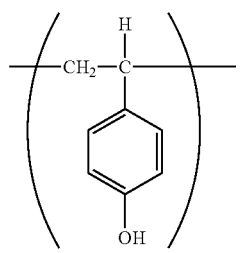

Formula (2)

and a repeating unit represented by Formula (6):

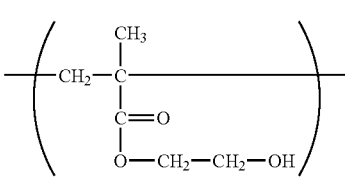

Formula (6)

and in which 20% or more of the repeating unit represented by Formula (2) is contained based on the total number of the repeating units in the polymer.

9. The method according to claim 1, characterized in that the polymer is a copolymer of p-vinylphenol and butyl acrylate, which comprises a repeating unit represented by Formula (2):

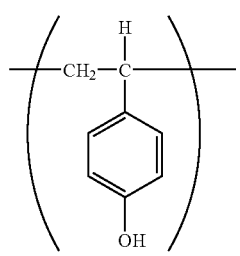

Formula (2)

and a repeating unit represented by Formula (7):

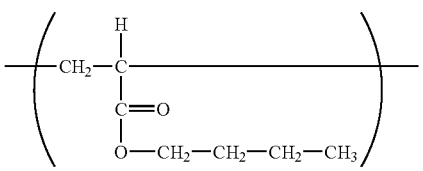

Formula (7)

and in which 20% or more of the repeating unit represented by formula (2) is contained based on the total number of the repeating units in the polymer.

10. The method according to claim 1, wherein the cross-linking agent is a methyoxymethylated glycoluril compound or methoxymethylated melamine compound.

11. The method according to claim 1, wherein the cross-linking catalyst is p-toluenesulfonic acid or pyridium-p-toluenesulfonic acid.

12. A method of manufacturing a semiconductor device forming an integrated circuit element by transferring an image on a substrate, comprising:
(A) applying a gap-filling material to a substrate having holes with an aspect ratio of 1 or more, which is defined as height/diameter, wherein the gap-filling material comprises a polymer solution comprising a polymer and a solvent and having a coefficient H of 0.046 or less, which is defined as (logarithmic change in viscosity (mPas))/(change in solid content concentration (% by weight)) and a viscosity of 1 to 80 mPas which is measured at a solid content concentration of 25% by weight, a cross-linking agent having at least two cross-linking forming functional groups, and a cross-linking catalyst;
(B) drying the polymer solution to form a planarized layer comprising gap-filling material on the substrate;
(C) forming a bottom anti-reflective coating on said planarized layer;
(D) applying a resist to said bottom anti-reflective coating; and
(E) performing an exposure, a development, and an etching on the substrate,
wherein the solvent comprises two or more solvents, comprising 20 to 80% by weight of a high boiling point solvent having a boiling point of 145° to 220° C. and having a boiling point that is 10° C. or more higher than a glass transition temperature of the polymer based on the whole solvent,
wherein the polymer is a homopolymer comprised of the repeating unit represented by Formula (1)

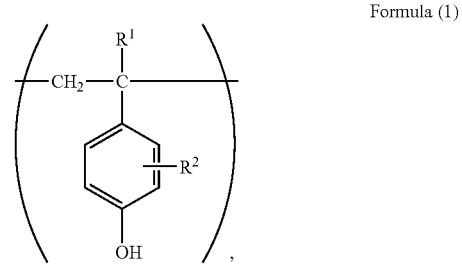

Formula (1)

wherein $R^1$ and $R^2$ each independently represent a hydrogen atom, a methyl group, a fluorine atom, a chlorine atom, a bromine atom or a cyano group, or a copolymer comprised of the repeating unit represented by Formula (1) and a repeating unit which is a vinyl group that contains an aromatic moiety or a carboxylic acid ester moiety on a side chain thereof, wherein a weight-average molecular weight of the polymer is from 500 to 30000,
wherein the repeating unit represented by Formula (I) is present in an amount of 20% or more based on the total number of repeating units in the polymer.

* * * * *